(12) United States Patent
Kimelman et al.

(10) Patent No.: US 7,197,680 B2
(45) Date of Patent: Mar. 27, 2007

(54) COMMUNICATION INTERFACE FOR DIAGNOSTIC CIRCUITS OF AN INTEGRATED CIRCUIT

(75) Inventors: Paul Kimelman, Alamo, CA (US); Ian Field, Walnut Creek, CA (US)

(73) Assignee: ARM Limited, Cambridge (GB)

( * ) Notice: Subject to any disclaimer, the term of this patent is extended or adjusted under 35 U.S.C. 154(b) by 441 days.

(21) Appl. No.: 10/417,330

(22) Filed: Apr. 17, 2003

(65) Prior Publication Data

US 2004/0210805 A1    Oct. 21, 2004

(51) Int. Cl.
*G01R 31/28* (2006.01)
(52) U.S. Cl. ...................................... 714/724
(58) Field of Classification Search ................ 714/724, 714/726
See application file for complete search history.

(56) References Cited

U.S. PATENT DOCUMENTS 5,734,660 A    3/1998 Fujisaki
5,842,007 A * 11/1998 Tarsky et al. ............... 712/225
6,041,406 A *  3/2000 Mann .......................... 712/227
6,134,481 A * 10/2000 Warren ......................... 700/28
6,968,472 B2 * 11/2005 Fernald ....................... 713/400

FOREIGN PATENT DOCUMENTS

EP    0 840 219    5/1998
EP    1 213 657    6/2002

* cited by examiner

*Primary Examiner*—James C Kerveros
(74) *Attorney, Agent, or Firm*—Nixon & Vanderhye P.C.

(57) ABSTRACT

An integrated circuit including diagnostic circuitry having serial scan chains or debug bus access circuits for establishing communication using an interface circuit coupled with a bi-directional serial link to an external diagnostic device. The bi-directional serial link carries both data and control signals. The serial protocol provides for a pacing signal for indicating to the external diagnostic device when it is ready to receive more data and/or when it has completed a particular diagnostic operation. This provides a self-pacing ability. A training signal generated by the external diagnostic device is detected by the interface circuit on initialization and used to derive sampling point timings.

63 Claims, 5 Drawing Sheets

Interface Training

Data Capture

COMMUNICATION INTERFACE FOR DIAGNOSTIC CIRCUITS OF AN INTEGRATED CIRCUIT

BACKGROUND OF THE INVENTION

1. Field of the Invention

This invention relates to the field of integrated circuits. More particularly, this invention relates to integrated circuits having on-board diagnostic circuitry with which it is desired to communicate via a diagnostic interface.

2. Description of the Prior Art

It is known to provide integrated circuits with on-board diagnostic systems. Examples of such systems are BIST controllers for testing on-chip memories, boundary scan cell chains and more general scan cell chains. It is known to provide dedicated diagnostic circuit interfaces to integrated circuits, for example such interfaces as utilised by the TAP controllers of JTAG diagnostic systems built in accordance with the IEEE Standard 1149. The JTAG interface typically requires four to six external pins dedicated for this use on the integrated circuit package.

As integrated circuits increase in complexity, size and performance, there is a general requirement for an increase in the number of external pin connections that can be made to the integrated circuit to support its functional (non-diagnostic) operation. It is desirable that the on-board diagnostic systems of an integrated circuit should have a small impact upon the functional behaviour and performance of the integrated circuit.

SUMMARY OF THE INVENTION

Viewed from one aspect the present invention provides an integrated circuit for processing data, said integrated circuit comprising:

a functional circuit operable to perform data processing operations;

a diagnostic circuit operable to perform diagnostic operations upon said functional circuit; and an interface circuit operable to provide communication between said diagnostic circuit and an external diagnostic device; wherein said interface circuit uses a bi-directional serial signal to transfer:

(i) control signals from said external diagnostic device to said diagnostic circuit to control said diagnostic operations of said diagnostic circuit; and (ii) diagnostic data between said external diagnostic device and said diagnostic circuit.

The invention recognises that the multiple external pins dedicated to on-board diagnostic systems represent a disadvantageous overhead in the provision of such on-board diagnostic systems. The present technique utilises a bi-directional serial signal to transfer both control signals and diagnostic data as required between the on-board diagnostic systems and an external diagnostic device, such as a computer with an interface card. This allows an advantageous reduction in the number of pins required to support the diagnostic functionality and in some embodiments this can be reduced to a requirement for a single external pin.

The diagnostic circuitry can perform a variety of diagnostic roles such as debugging operations and manufacturing test operations. The diagnostic circuitry may also be re-used to provide functionality such as manufacturing programming or manufacturing configuration, which would not normally be considered diagnostic operations and yet can be supported by the diagnostic circuitry in a manner which enables its use outside of the diagnostic field.

The control signals passed by the bi-directional serial signal can take a variety of different forms. One preferred type of control signal is a reset signal operative to reset the diagnostic circuit. This reset signal can advantageously be provided in the form of holding the bi-directional serial signal at a predetermined reset level for a predetermined reset period.

Another strongly advantageous form of control signal is a pacing signal from the diagnostic circuit to the external diagnostic device. The diagnostic circuit can in this way be self-pacing in the sense that it can indicate to the external diagnostic device when it is ready to receive more data and when it has completed a diagnostic operation, such as a long duration complex operation.

The pacing signal can advantageously be provided by dedicating a time slot within the serial signal protocol dedicated to the pacing signal and in which time the diagnostic circuit may impose a signal level upon the bi-directional serial signal in a manner that can be sensed by the external diagnostic device and used to communicate the pacing information.

A further form of control signal is a start signal generated by the external diagnostic device that may be used to indicate the start of a frame of serial data.

A stop signal can also be provided at the end of a frame of serial data and used to signal an abort of the operation or frame. If the stop signal is held at a predetermined level then this forced an idle state.

In preferred embodiments of the invention the timing of the sampling points to be used for sampling the bi-directional serial signal by the integrated circuit can be derived from the bi-directional serial signal itself by using a training mode in which a training signal is sent from the external diagnostic device and the integrated circuit samples the signal received. The integrated circuit can find a clock ratio (number of IC clocks to training clock pulses) or the external diagnostic circuit can adjust the timing down) until the correct training signal is stably received. In this way, the integrated circuit can be "synchronised" with the external diagnostic device, this synchronisation having to be maintained by detecting signal edges or the like in the serial data on an ongoing basis so as to avoid the synchronisation being lost.

Advantageously the integrated circuit initialises into the training mode, such as following a reset of the interface circuit. The pacing signal may be used to indicate that the integrated circuit has successfully received the training signal and synchronised itself.

It will be appreciated the diagnostic circuit with which communication is made via the interface circuit and the bi-directional serial signal can take a wide variety of different forms. Preferred examples are one or more of scan chains for capturing data from the functional circuitry or applying data to the functional circuitry as well as one or more debug bus access circuits operable to provide communication with the bus of the functional circuitry. Other forms of diagnostic circuitry are also possible.

As well as operating in the non-clocked mode discussed above, the interface circuit is also advantageously operable in a clocked mode in which communication is clocked by a separate clock signal that is also used by the integrated circuit. The use of a separate clock signal in this way, which may be generated by the integrated circuit, applied to the integrated circuit, or derived from either of these possibilities, enables higher data rates to be achieved since the synchronisation is more secure than relying upon sampling points which are checked subsequently.

The integrated circuit is preferably switchable between the clocked and non-clocked modes but will initialise in the non-clock mode as this is generally the slower and least demanding of the modes to be supported.

Viewed from another aspect the present invention provides a diagnostic device for performing diagnostic operations upon an integrated circuit, said diagnostic device comprising:

an interface circuit operable to provide communication between said diagnostic device and a diagnostic circuit within said integrated circuit; wherein said interface circuit uses a bi-directional serial signal to transfer:

(i) control signals from said diagnostic device to said integrated circuit to control diagnostic operations of performed by said integrated circuit; and (ii) diagnostic data between said diagnostic device and said integrated circuit.

Viewed from a further aspect the present invention provides a method of communicating with a diagnostic circuit operable to perform diagnostic operations upon an functional circuit within an integrated circuit, said method comprising the step of:

using a bi-directional serial signal to transfer:

(i) control signals from an external diagnostic device to said diagnostic circuit to control said diagnostic operations of said diagnostic circuit; and (ii) diagnostic data between said external diagnostic device and said diagnostic circuit.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
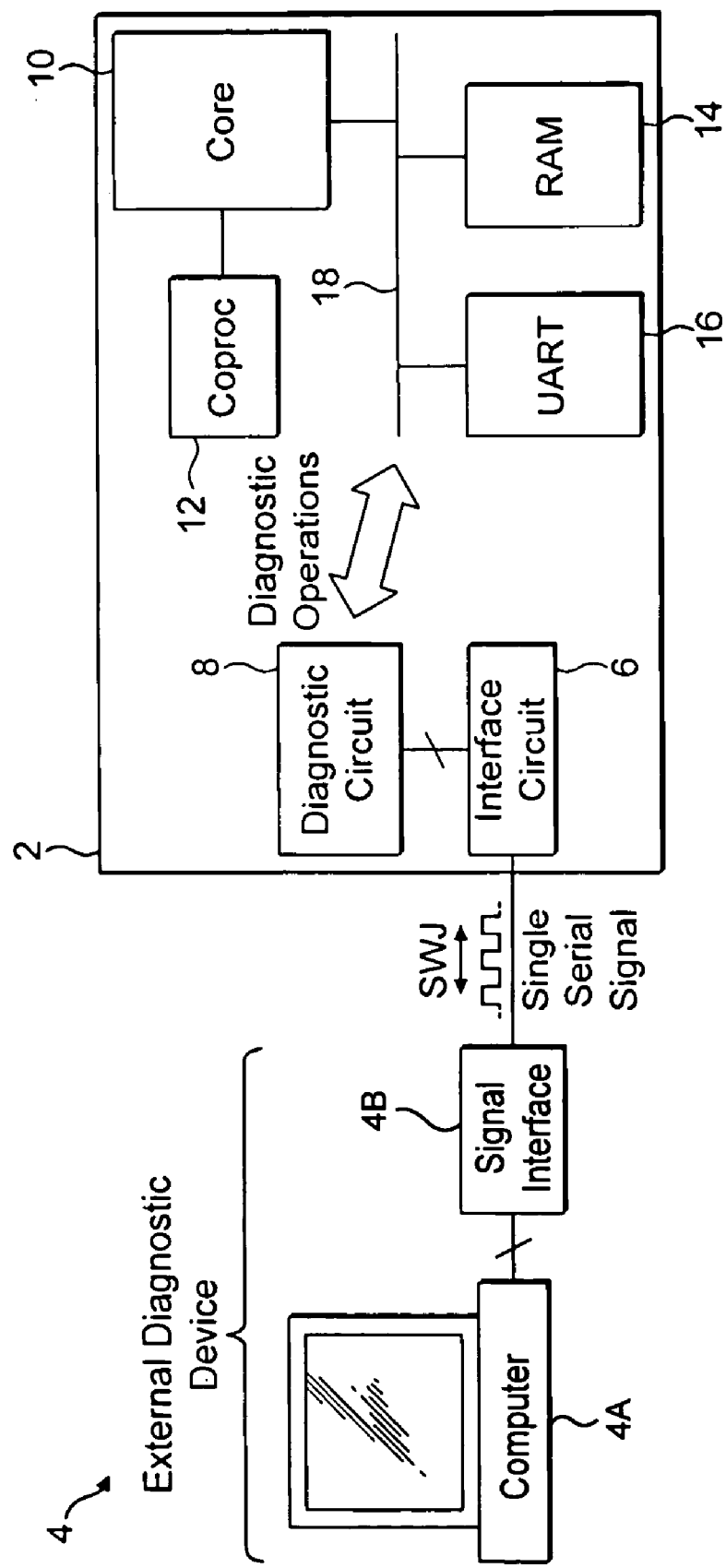
FIG. 1 schematically illustrates an integrated circuit including on-board diagnostic systems connected to an external diagnostic device.

FIG. 1 illustrates an integrated circuit 2 connected to an external diagnostic device 4 which includes a computer 4A coupled to a signal interface 4B. The connection between the external diagnostic device 4 and integrated circuit 2 is via a bi-directional serial interface, such as SWJ. Within the integrated circuit 2, an interface circuit 6 receives the bi-directional signal(s). The data decoded from that serial signal and control signals decoded from that serial signal are passed to a diagnostic circuit 8 which performs diagnostic operations on the other elements of the integrated circuit 2 in dependence upon those control signals and data. Data and control signals may also be passed back from the integrated circuit 2 to the external diagnostic device 4 via the bi-directional serial signal. The integrated circuit 2 will typically be a system-on-chip (SoC) integrated circuit.

The functional circuits within the integrated circuit 2 include a processor core 10, a coprocessor 12, a memory 14 and a serial UART device 16. These functional circuits are connected by a functional bus 18 (e.g. an AMBA, AHB or other bus for connecting functional circuits). The diagnostic circuit 8 is schematically illustrated as a block within the integrated circuit 2. It will be appreciated that this diagnostic circuit could take a variety of different forms and may, for example, include serial scan chains extending around the periphery of the integrated circuit 2, certain functional elements or within certain functional elements as required. The diagnostic circuitry 8 may also have other forms such as a BIST device and the like.

In use, an engineer using the external diagnostic device will command certain diagnostic operations to be performed on the integrated circuit 2 in response to control signals and data passed to the integrated circuit 2 along the bi-directional serial interface and via the interface circuit 6. Result data will be passed back through the interface circuit 6 along the bi-directional interface to the external diagnostic device 4.

Figure 2:
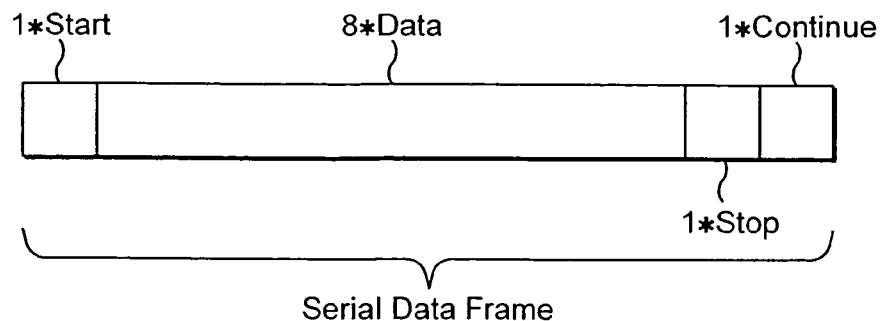
FIG. 2 illustrates a serial data frame for use in communicating between an external diagnostic device and an interface circuit of an integrated circuit.

FIG. 2 illustrates a frame of serial data. This comprises a start bit followed by eight data bits, a stop bit and a continue bit. The stop bit and the continue bit can be considered to be part of a stop signal terminating the serial frame. The use of this serial data frame protocol to pass 8-bit data values, which may be pure data values or contain embedded control instructions, to the diagnostic circuit 8 as well as the control functions provided by the start bit, stop bit and continue bit themselves will be described in the following. It will be appreciated that in different embodiments the number of bits in a frame could be different, including different numbers of data, start and/or stop bits.

Figure 3:
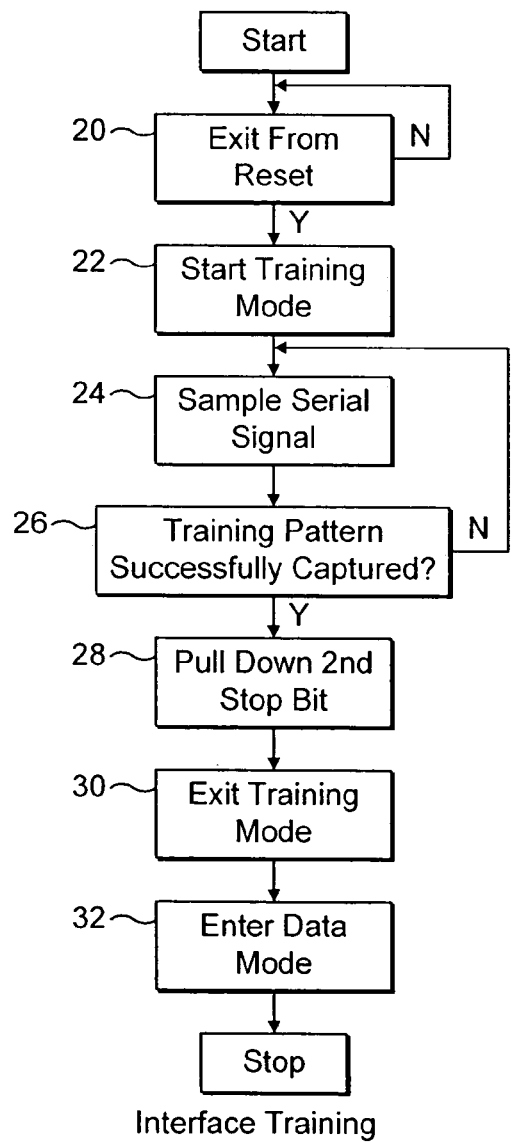
FIG. 3 is a flow diagram schematically illustrating the interface training operations of an interface circuit.

FIG. 3 is a flow diagram illustrating the training of the interface circuit 6. The interface circuit 6 is operable in a non-clocked mode to extract timing information from the serial data signal itself as to the sampling points to be used. This is achieved by training the interface circuit 6. The training takes the form of the external diagnostic device 4 sending a known serial data stream (e.g. alternating values of 0 and 1), with the interface circuit seeking to sample this training pattern in a way that the correct sequence is properly received. The interface circuit 6 initialises upon powerup or following a reset into the training mode during which it looks to receive the training pattern. When it receives this training pattern it issues a continue signal which the external diagnostic device 4 can interpret to mean that the training pattern has successfully been received and accordingly the interface circuit 6 is now using sampling points appropriate to the serial data stream. The external diagnostic device can alter (e.g. lower) the data rate of the serial data until the interface circuit 6 is able to correctly receive it and issue the appropriate indication that it is trained.

FIG. 3 illustrates the interface circuit 6 waiting until it exits from reset at step 20. At step 22 the training mode is entered. At step 24 the interface circuit 6 samples the bi-directional serial signal at a sequence of points seeking to identify the training pattern of alternating values of 0 and 1. The sampling points will normally be defined by the clock signal being used within the integrated circuit 2, the sampling points being normally a fixed multiple or other derivative of this clock frequency.

At step 26 after the interface circuit 6 has sampled what it believes to be a full frame of serial data it tests that received pattern to see if it matches the training data pattern. If a match is not found, then processing returns to step 24 and the sampling continues. It will be appreciated that it is the responsibility, in this embodiment, of the external diagnostic device 4 to vary the data rate of the bi-directional serial signal until it can be properly received by the integrated circuit 2. This generally accords with the principle of offloading the complexities of diagnostic operation provision into the external devices 4 rather than having to provide these within the integrated circuit 2.

When step 26 identifies that the training pattern has successfully been received, then step 28 serves to pull down the serial data value during the continue bit period to a zero level. The continue bit normally floats at a level corresponding to a one unless it is actively pulled down by the integrated circuit 2 itself. The pulling down of the continue bit during the training mode, i.e. after an initialisation, signals to the external diagnostic device 4 that the integrated circuit 2 has been successfully trained to the bi-directional serial signal data rate of the external device 4 and is now capable of communicating via the interface circuit 6. At step 30 the training mode is exited and at step 32 the data mode is entered.

Figure 4:
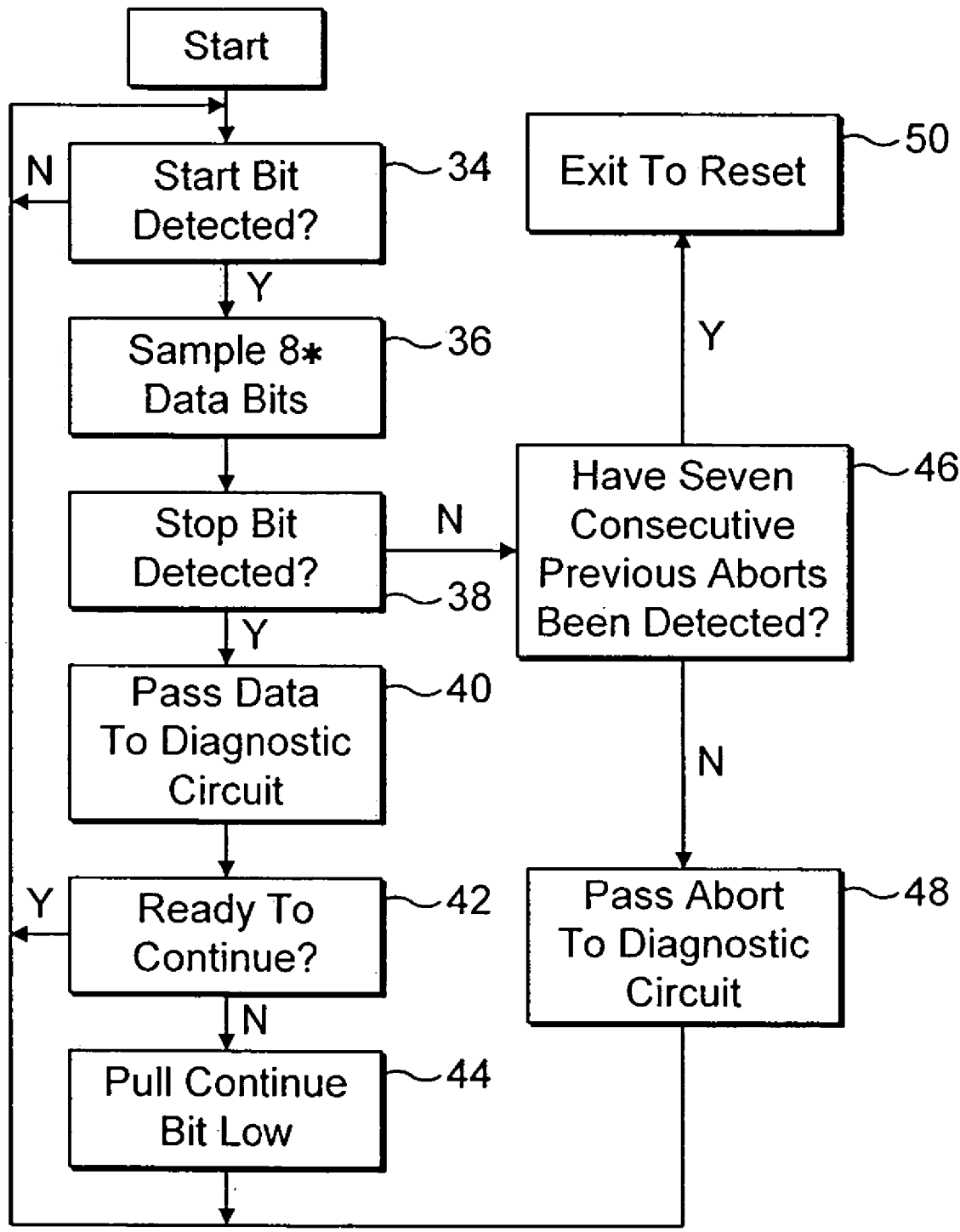
FIG. 4 is a flow diagram schematically illustrating the data capture operations of an integrated circuit.

FIG. 4 is a flow diagram schematically illustrating the operation of the interface circuit 6 during the normal data capture mode. At step 34, the circuit 6 interface waits for receipt of a start bit at the beginning of a serial data frame. A start bit is always, in this example, a value of zero. Accordingly, if the external diagnostic device 4 holds the bi-directional serial signal level at a one, then the interface circuit 6 will continue to wait for a start bit and will effectively be held idle.

Once the start bit has been detected, processing proceeds to step 36 at which eight data bits are sampled using the sample timings established in the training mode described in relation to FIG. 3. Following this, step 38 serves to detect whether a stop bit, which, in this example, always has a value of one, is present. The presence of the stop bit can be used as a check for the frame being properly received and can also be used by the external diagnostic device to effectively abort the serial data preceding the stop bit.

If the stop bit is successfully detected, then step 40 serves to pass the eight data bits to the diagnostic circuit 8. These eight data bits may be data values to be supplied to the integrated circuit 2 as stimulus, or control instructions for the diagnostic circuit 8 to configure its actions, or may have other uses. It will be appreciated that when the state of the diagnostic circuit 8 is such that the diagnostic operation required is the passing out of data from the integrated circuit 2 to the external diagnostic device 4, then instead of sampling eight data bit values at step 36, the interface circuit can instead assert appropriate data bit values it wishes to pass out to the external diagnostic device 4 with these then being detected and recorded by that external diagnostic device 4.

Following step 40, step 42 determines whether or not the interface circuit is ready to continue. It may be that the diagnostic circuit is busy performing a diagnostic operation, which may be a complex operation, requiring a relatively long time to complete, and it is inappropriate for further data to be sent from the external diagnostic device until that operation is completed. The further data from the external diagnostic device 4 may be an instruction for a following diagnostic operation, it not being possible to start this until the preceding operation has stopped. If the interface circuit 6 is not ready to continue, then processing proceeds to step 44 at which the interface circuit 6 forces the serial signal level to a zero during the continue bit period. This indicates to the external diagnostic device 4 that the serial communication should not continue. Processing then returns to step 42 until the interface circuit 6 is ready to continue.

If the determination at step 38 was that the stop bit was not properly detected, then processing proceeds to step 46. Step 46 determines whether seven consecutive immediately preceding aborts (none assertion of the stop bit) have occurred in which case this will be the eighth and a reset is triggered at step 50. If the test at step 46 is not met, then step 48 passes an abort to the external diagnostic circuit.

It will be appreciated that the training pattern signal levels with particular meaning and other features of the serial data protocol could all be varied whilst still embodying the present technique.

A further description of the bi-directional serial communication referred to above is given in the following:

Terms and Abbreviations

The following description uses terms and abbreviations as specified:

| Term | Meaning |
|---|---|
| SWO | Single Wire Output. An application specific trace component (not to be confused with general trace, which is processor specific). |
| DBT | This is a TAP block which acts as an AMBA (AHB or AHB-Lite) master for access to a system bus. It may optionally also provide scan chain access. |
| AMBA | The ARM Bus standard within a chip. |
| JTAG | IEEE Joint Test Access Group specification for 4-6-wire interface to control a serial interface to scan chains. JTAG is used for debug as well as test. SWJ is based on the underlying debug JTAG model. ScanTAP is based on the test part of JTAG. |
| Emulator | A misnomer, used to refer to a run control box (piece of HW) attached to a chip for debug. Normal emulators are JTAG based. A box connected to a SWJ interface would also be called an emulator for historical reasons. |
| OCRC | On-Chip Run-Control component of SWJ. This provides the actual protocol handling and interface to DBT and scan chains. |

Introduction

This is a proposal for a small single-wire JTAG component. The SWJ component is used to debug and test ARM based processors (including multi-core) using a single wire interface instead of the typical 4–6 wire JTAG interface. The single wire interface literally uses one wire for communication in both directions. The high-speed SWJ support requires visibility to an additional signal/pin, which contains a clock (but it does not have to be a clock dedicated to SWJ). The clock (which can be divided against) allows high speeds by providing a clean edge for sampling.

The non-clocked mode allows up to about 3 MHz speeds (data rate is $8/11^{th}$ of that speed). The clocked mode allows up to about 40 MHz rates (data rate is $8/11^{th}$ of that speed). The general wire protocol is framed serial with 1 start, 1 stop bit, a continue bit for each 8 data bits. A held stop bit allows unlimited idle time. A held 0 is a bus reset. The emulator drives the interface, with the continue bit indicating when return data is provided by the target. This allows the emulator to pend until the target indicates completion of an operation. So, unlike JTAG, the emulator can be paced properly.

The other part of SWJ is the On-Chip Run-Control (OCRC). The OCRC supports the protocol used for DBT access, JTAG access, and optionally direct scan chain access (via DBT). The OCRC has allowances for special ROM constant strings to enhance the performance of any TAPs in the system (cores, devices, etc). In general OCRC's protocol is highly optimised for SWJ to insure highest possible speeds. In general, this will usually mean that SWJ will be much faster than straight JTAG at the same speed grades.

In reviewing the SWJ electrical interface, it is important to note that the design was carefully chosen to minimise costs to the target and to allow for very low cost emulators. In general, SWJ allows for choice of emulator classes to balance costs against speed. So, a low-end pin-starved MCU will be able to use a very low cost emulator and a high-end fast part will be able to use a much more powerful emulator. But, the interface is designed to support the low and high speed forms (non-clocked and clocked), so that either emulator can be used for both parts.

SWJ Electrical Design

Figure 5:
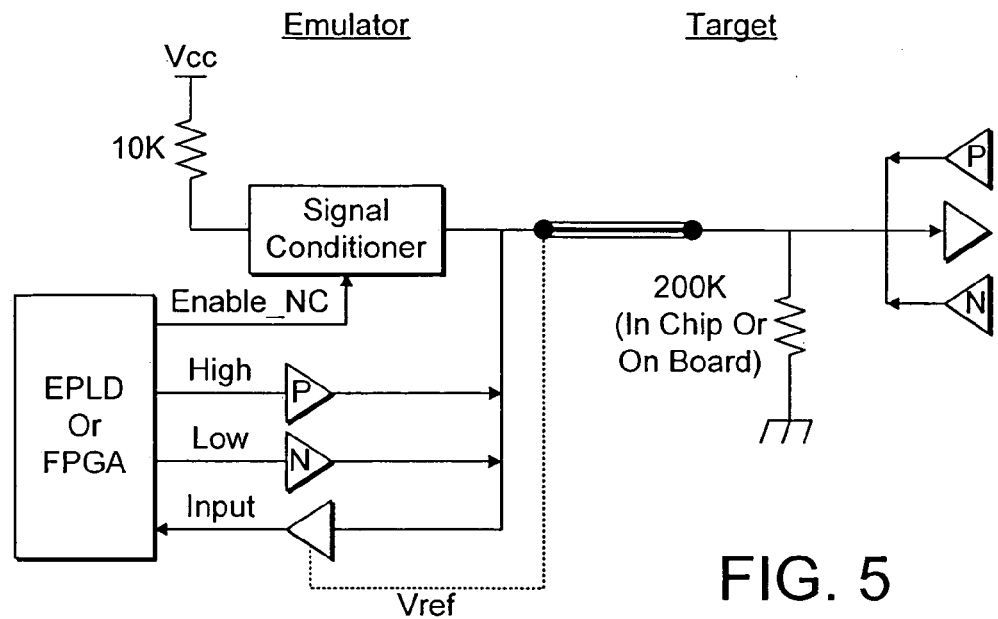
FIG. 5 is a diagram schematically illustrating an integrated circuit incorporating a diagnostic bus-master circuit in non-clocked mode for issuing bus transactions to carry out diagnostic operations upon an integrated circuit.
Figure 6:
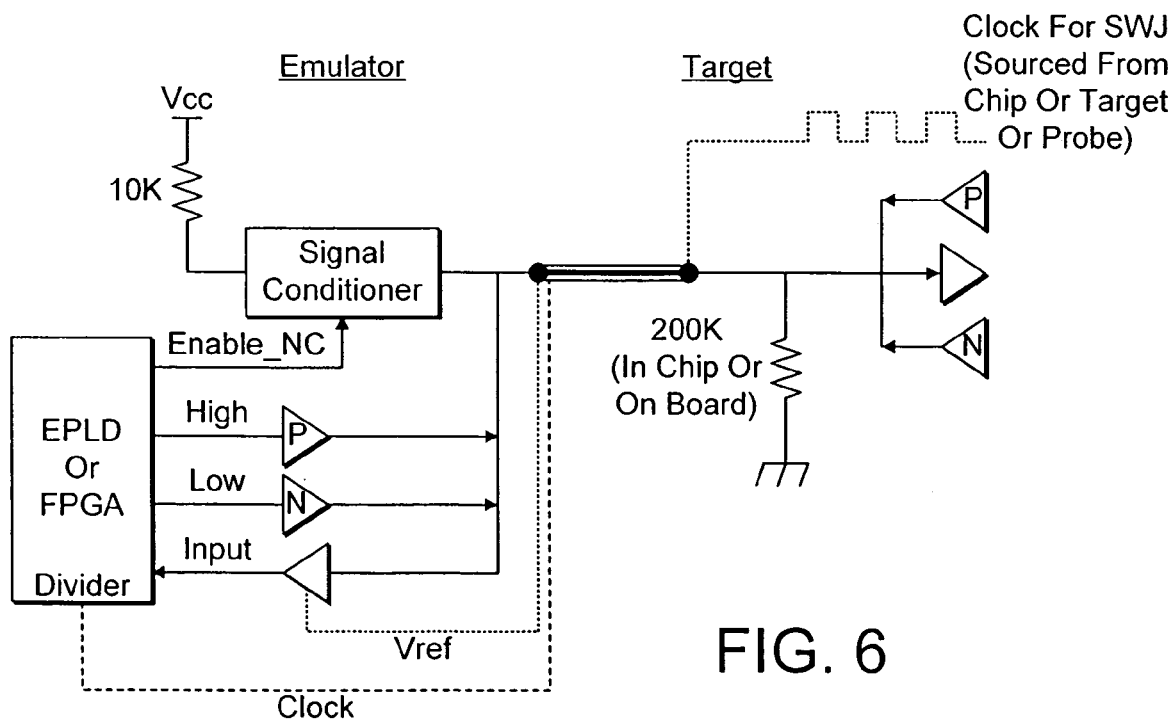
FIG. 6 is a diagram schematically illustrating an integrated circuit incorporating a diagnostic bus-master circuit in clocked mode for issuing bus transactions to carry out diagnostic operations upon an integrated circuit.

FIG. 5 shows the block diagram of a non-clocked connection. FIG. 6 shows the block diagram of a clocked connection. All emulators must support non-clocked mode, but clocked mode is optional. This is because SWJ always comes up in non-clocked mode (from reset). The circuits are designed to make switching between the two trivial for both the emulator and target.

Note that the 200K pull-down resistor on the target side may be in the chip or on the board.

Non-Clock Mode Electrical Details

The non-clocked mode signal conditioner in the emulator is used to snap the signal from LOW to HIGH quickly. The 10K resistor will only float the signal to HIGH, but the signal conditioner (bus hold style feedback circuit) will detect the current flow change and drive the signal to HIGH until past RMS. At that point, it will drop out and allow the 10K resistor to keep the signal HIGH. The shape of edge will be clean enough for the lower speeds (3 MHz or less) of non-clocked mode. For very low-end parts, it is possible to use the non-clocked pull-up model to power the SWJ debug end of the part. This will not be the normal model, but is feasible using capacitance drain.

Clock Mode Electrical Details

The target will normally supply the clock for clocked mode. The clock may be from the chip (output), or from the target board into the chip (input). It is possible also to construct a pod (emulator connection) which generates the clock via crystal or PLL, but the emulator will not ever generate the clock directly. In any case, it does not have to be a dedicated clock for SWJ (can be shared for other uses), but it does have to be clean.

It is assumed that the clock will be divided in most cases; it is suggested to keep the clock in the 10 MHz to 100 MHz range. Any dividing is agreed and determined while still in non-clocked mode using the command protocol. The reason for using a divider is that the same clock can be used for high speed SWO (or other purposes), which would want a faster clock source. The protocol of SWJ defines how to use a divided clock cleanly. Note that SWJ must use the clock as its clock source (although this can be switched when going between clocked and non-clocked mode). The reason for this model (vs. sampling) is that the clock edges are used to support the bi-directional interface on a single pin.

Wire Protocol for SWJ

The SWJ wire interface is based loosely on the RS-232 model (whether clocked or not). Each 8-bit data packet is framed with 1 start bit and 2 stop bits. But, the $2^{nd}$ stop bit is really a special reply marker as explained below. The format is:

| 0=start | 8-bits of data (either direction) | 1=stop | 1=continue, 0=not-continue |
| --- | --- | --- | --- |

The significant difference is the $2^{nd}$ stop bit. This $2^{nd}$ bit is left high when the packet is accepted and the emulator should continue. It is driven low when the packet should be resent. This mechanism allows the target to pace the emulator to the speed it can handle. This pacing can be used both for byte-by-byte management (such as when the SWJ clock speed is faster than a core (at say 32 KHz)) as well as operation completion (such as a DBT memory transaction).

Note that for non-clocked mode, the target simply leaves the line high (active pullup) if CONTINUE, else pulls low. For clocked mode, the target must hold high for CONTINUE, else pull low.

Wire Protocol Modes and States

In general, there are 4 wire protocol modes or states:

1. Reset. This occurs when the wire is held low for 8 or more packets. The target detects this because the stop bit is missing. This is called an alert. If more than 8 alerts are detected, the target can assume a reset of the interface has been asserted (this has no effect on anything but SWJ). The SWJ interface reverts to non-clocked mode. Note that not having an emulator connected will cause a reset due to the pull-down resistor.

2. Training—only in non-clocked mode. After a reset, the emulator sends a data packet with 0x55 (0b01010101). The target uses this to auto-baud on the non-clocked sequence or to verify the divider on a clocked system. The training packet will continue to be sent when the $2^{nd}$ stop bit is set to CONTINUE (1). Training mode will be exited when the $2^{nd}$ stop bit is set to NOT CONTINUE (0). If more than 8 CONTINUE bits are detected by the emulator, it may choose to try reset again and then run the speed slower for the training mode. This will accommodate the case of a very slow chip (which cannot oversample enough at 3 MHz non-clocked mode).

3. Data. The data mode is the normal packet mode. This mode is entered after leaving training mode. Between each data packet may be idle states (if the stop lasts longer than 1 clock). So, introduction of a start bit always restores to normal data mode and data state.

4. Idle. An idle state is the line held in stop state (no start sent). This means that the pin is held high. The idle state can be held as long as needed. It is exited by the introduction of a start bit. In non-clocked mode, the start bit comes out at the next natural internal clock point (to the emulator). In clocked mode, the start comes out on a clock edge.

Reset Mode

The reset mode is defined as 8 or more packets with a deasserted stop bit (stop is 0 instead of 1). In other words, 8 packets worth of abort causes a reset.

The definition of what actions to take on reset are specific to SWJ and the OCRC block. The main intent is to clear the line only, so aborting any pending OCRC mode/command is the main objective as well as clearing any internal state of the SWJ block.

Training Mode

Training mode is only entered after reset. The training command is 0x55 as data. Training mode is only exited when the target drives the $2^{nd}$ stop bit low. This allows the target time to auto-detect the baud rate (speed of data clock in non-clocked mode) as well as to insure that the target can train on the data. If the data clock is too fast, the $2^{nd}$ stop bit will be left in the floating high state—this allows the emulator to detect that the target cannot train (and so can try lower speeds).

| Start=0 | 1 | 0 | 1 | 0 | 1 | 0 | 1 | 0 | Stop | CONTINUE(1/0) |
|---|---|---|---|---|---|---|---|---|---|---|

Data Mode

Data mode follows immediately after training mode is exited via the NOT CONTINUE bit (0). Data mode is the normal operating mode for SWJ whether clocked or non-clocked. Data mode allows issuance of commands at the level above SWJ wire protocols. Data mode commands include commands aimed at the SWJ interface as well as ones routed to parts of the On-Chip Run-Control (OCRC) block. The main SWJ data mode commands include:

Get ID—reads back the ID of the SWJ module. This may change to an OCRC command. This command will also indicate if clock mode is possible.

Set clock mode divide counter. This command allows setting the counter and then committing the switch to clocked mode. The switch to clock mode is followed by 8 packets worth of idle state (see below) and then a GetID command in clocked mode. If the GetID command fails, the emulator may use reset to revert to non-clocked mode.

Abort OCRC current action. In the event of continuous NOT CONTINUE responses from the SWJ interface on a data command, the emulator may use the Abort command to request that OCRC abort its current action (if possible) and return to a known state. Note that Abort is the same command in all subsystems as it is in SWJ.

The main OCRC commands include:

Get ID—reads back the SWJ and OCRC ID information. This information includes version of the blocks as well as information on the system design parameters (including whether clocked mode supported, if DBT ScanTAP is supported, if JTAG access is supported, and if DBT MemTAP is supported).

Select DBT MemTAP. This selects the MemTAP for command feed. Until exited (via MemTAP exit request or Abort), the commands that follow are fed to the MemTAP component. Note that Abort is the same command in all subsystems as it is in SWJ. Thereafter feeds 34 bit data and optimising commands (such as multiple 32 bit data with the same 2 bit extension, repeats, etc).

Select DBT ScanTAP. This selects the ScanTAP for command feed. This operates in the same manner as MemTAP command feed.

Select JTAG command. This selects the JTAG wrapper within OCRC. This allows feeding of JTAG operations for systems where a JTAG chain is in use. The commands that are sent to this unit are designed to optimise JTAG traffic, including driving TCK sequences, optimised Shifts, and ROM-constant feeds for common operations applicable to the TAPs in the system (so controlled by a system designer).

Select Other command. This selects other OCRC command feeds—reserved.

An example data mode command looks like:

| Start=0 | 1 | 1 | 0 | 0 | 0 | 1 | 0 | 0 | Stop=1 | CONTINUE(1/0) |
|---|---|---|---|---|---|---|---|---|---|---|

Which has value of 0x23. The CONTINUE bit will be left at 1 if the byte is accepted and driven low if needs to be repeated. That is, the NOT CONTINUE bit state indicates that the byte (0x23) was not accepted by the target and should be sent again (and again if still not accepted). This forms the pacing mechanism.

Note that the CONTINUE or NOT CONTINUE indicator can occur for any of 3 reasons:

The OCRC clock rate is too slow to accept the next byte in general (clock rate of OCRC is same as system, whereas clock rate of SWJ may be different).

The OCRC or sub-system is still processing the previous byte (such as running TCKs, bus operations, or scans).

The OCRC is doing a repeated test (such as reading a scan chain and comparing against an expected value).

These three reasons allow pacing of the raw data rate (how fast the emulator can feed bytes in general), the command completion rate (how fast the sub-system can execute the command itself), and complex operation rates. The pacing can change dynamically based on changes in internal clock rate as well as changes in type of operations (some forms of memory may be slower than others, for example). This forms a powerful part of the SWJ strategy, and helps SWJ to be much faster than straight JTAG in many cases (where polling and pacing issues cause many problems).

Idle State

Idle state is a state within Data mode. The idle state forms a gap or filler between data packets. The emulator simply holds the stop state (high) for as long as wanted before introducing the next packet (as indicated by the start bit which is low).

| ... Stop=1 | 1 | 1 | 1 | ... | 1 | 1 | 1 | Start=0 | Command ... |
|---|---|---|---|---|---|---|---|---|---|

SWJ and OCRC Fitting Into System

Figure 7:
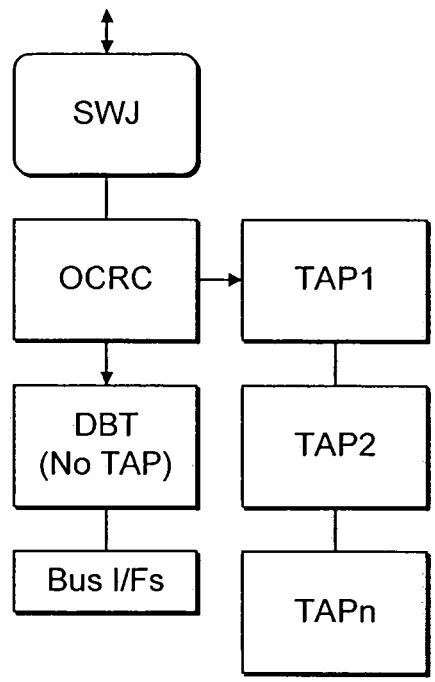
FIGS. 7 and 8 illustrate aspects of a communication technique for use between an external diagnostic device and an integrated circuit.
Figure 8:
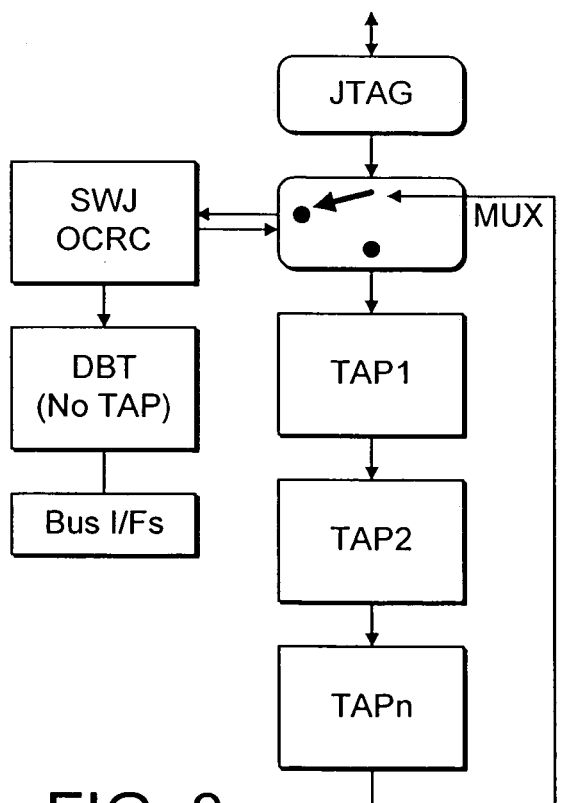

FIGS. 7 and 8 show how SWJ and OCRC can fit into the system. FIG. 7 shows the standard SWJ model for a system with JTAG TAPs (including ARM EICE). FIG. 8 shows a novel hybrid SWJ model, which allows existing JTAG systems to work with the same chip. An SWJ emulator can switch the target over to SWJ from JTAG using a fixed sequence.

The arrangement of FIG. 7 uses SWJ to access DBT (MemTAP and possibly ScanTAP) and a JTAG scan chain (such as for ARM EICE blocks as well as other devices).

The arrangement of FIG. 8 uses a hybrid approach for vendors who must have legacy JTAG support. $3^{rd}$ party vendors can continue to plug in JTAG emulators and support the TAPs as usual. New generation emulators send a specific JTAG sequence (an unused IR to one TAP) to switch to SWJ.

This reuses the same pins (3 of them) with TCK unused (to prevent problems) and nTRST also unused (if wired at all). The model for this is that TMS is the SWJ data signal, TDO is the SWO signal if used, and TDI is the clock source if clocked mode is supported. A SWJ emulator can detect if in JTAG or SWJ mode by holding TCK low and driving TMS through the reset and then Training mode. If the $2^{nd}$ stop bit is not driven low after 8 packets, the emulator can assume that it is somehow back in JTAG mode (since TCK is held low, JTAG does not care if you change TMS). In the event it is in JTAG mode, the emulator drives a 1 based pattern to detect the IR length and then sends a fixed pattern to the $1^{st}$ TAP in the scan chain with the unused ARM EICE IR sequence—this then switches the target into SWJ mode. After it is in non-clocked SWJ, the emulator can switch to clocked SWJ mode if supported. It can also support SWO output on TDO. Note that the emulator does not have to be a full JTAG emulator to do this minimal set of operations.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. An integrated circuit for processing data, said integrated circuit comprising:
   a functional circuit operable to perform data processing operations;
   a diagnostic circuit operable to perform diagnostic operations upon said functional circuit; and
   an interface circuit operable to provide communication between said diagnostic circuit and an external diagnostic device; wherein
   said interface circuit is configured to use a bi-directional line carrying a bi-directional serial signal to transfer:
   (i) control signals from said external diagnostic device to said diagnostic circuit to control said diagnostic operations of said diagnostic circuit; and
   (ii) diagnostic data between said external diagnostic device and said diagnostic circuit.

2. The integrated circuit as claimed in claim 1, wherein said diagnostic circuit is operable to perform one or more of:
   debugging operations;
   manufacturing test operations;
   manufacturing programming operations; and
   manufacturing configuration operations.

3. The integrated circuit as claimed in claim 1, wherein said bi-directional line carrying the bi-directional serial signal is operable to communicate a pacing signal from said diagnostic circuit to said external diagnostic device, said pacing signal being operative to indicate whether or not said diagnostic circuit is ready for communication.

4. The integrated circuit as claimed in claim 3, wherein the bi-directional serial signal has a serial signal protocol comprising different time slots for communicating different signals, said diagnostic circuit forcing said bi-directional serial signal to a predetermined pacing level during a pacing signal time slot.

5. The integrated circuit as claimed in claim 3, wherein said interface circuit is operable in a training mode to be responsive to a training signal of a predetermined form sent from said external diagnostic device to determine sample point timing for sampling said bi-directional serial signal and said pacing signal indicates that training has completed successfully.

6. The integrated circuit as claimed in claim 1, wherein said bi-directional line carrying the bi-directional serial signal is operable to communicate a pacing signal from said diagnostic circuit to said external diagnostic device, said pacing signal being operative to indicate whether or not said diagnostic circuit has completed an operation.

7. The integrated circuit as claimed in claim 1, wherein the bi-directional serial signal has a serial signal protocol comprising different time slots for communicating different signals, said bi-directional line carrying the hi-directional serial signal being operable to communicate a start signal indicative of a start of a frame of serial data, said start signal being said bi-directional serial signal being driven to a predetermined start level to define a start signal time slot.

8. The integrated circuit as claimed in claim 7, wherein said communication is held idle by said external diagnostic device holding said bi-directional serial signal at a level different to said predetermined start level and thereby delaying said start signal time slot until said bi-directional serial signal changes to said predetermined start level followed by a next frame of data being communicated.

9. The integrated circuit as claimed in claim 1, wherein the bi-directional serial signal has a serial signal protocol comprising different time slots for communicating different signals, said hi-directional line carrying the bi-directional serial signal being operable to communicate a stop signal indicative of an end of a frame of serial data, said stop signal being said hi-directional serial signal being driven to a predetermined stop level during a stop signal time slot.

10. The integrated circuit as claimed in claim 9, wherein said diagnostic circuit uses receipt of a first part of said stop signal to indicate an abort of diagnostic operations.

11. The integrated circuit as claimed in claim 9, wherein said diagnostic circuit uses receipt of a second part of said stop signal to confirm receipt of said frame of serial data by said diagnostic circuit.

12. The integrated circuit as claimed in claim 1, wherein said interface circuit is operable in a non-clocked mode in which said communication is clocked in dependence upon transitions detected within said bi-directional serial signal.

13. The integrated circuit as claimed in claim 1, wherein said interface circuit is operable in a training mode to be responsive to a training signal of a predetermined form sent from said external diagnostic device to determine sample point timing for sampling said bi-directional serial signal.

14. The integrated circuit as claimed in claim 13, wherein said interface circuit initialises into said training mode.

15. The integrated circuit as claimed in claim 14, wherein said initialisation follows a reset of said interface circuit.

16. The integrated circuit as claimed in claim 1, wherein said diagnostic circuit comprises one or more of:
   (i) one or more scan chains operable to capture diagnostic data from said functional circuitry;
   (ii) one or more scan chains operable to apply diagnostic data to said functional circuitry; and
   (iii) one or more debug bus access circuits operable to provide communication via a bus within said functional circuit.

17. The integrated circuit as claimed in claim 1, wherein said interface circuit is operable:
   (i) in a clocked mode in which said communication is clocked by a separate clock signal used by said integrated circuit; and
   (ii) in a non-clocked mode in which said communication is clocked in dependence upon transitions detected within said bi-directional serial signal.

18. The integrated circuit as claimed in claim 17, wherein in said clocked mode, said communication is clocked by a clock signal being a multiple of a clock signal used by said integrated circuit.

19. The integrated circuit as claimed in claim 17, wherein said interface circuit is operable to initialise in said non-clocked mode and is switchable to said clocked mode.

20. An integrated circuit for processing data, said integrated circuit comprising:
   a functional circuit operable to perform data processing operations;
   a diagnostic circuit operable to perform diagnostic operations upon said functional circuit; and
   an interlace circuit operable to provide communication between said diagnostic circuit and an external diagnostic device; wherein
   said interface circuit is configured to use a bi-directional line carrying a bi-directional serial signal to transfer:
   (i) control signals from said external diagnostic device to said diagnostic circuit to control said diagnostic operations of said diagnostic circuit; and
   (ii) diagnostic data between said external diagnostic device and said diagnostic circuit,
   wherein said bi-directional serial signal is operable to communicate a reset signal from said external diagnostic device to said diagnostic circuit, said reset signal being operative to reset said diagnostic circuit.

21. The integrated circuit as claimed in claim 20, wherein said reset signal comprises said external diagnostic device holding said bi-directional serial signal carried on said bi-directional line at a predetermined reset level for a predetermined reset period.

22. A diagnostic device for performing diagnostic operations upon an integrated circuit, said diagnostic device comprising:
   an interface circuit operable to provide communication between said diagnostic device and a diagnostic circuit within said integrated circuit; wherein
   said interface circuit is configured to use a bi-directional line carrying a bi-directional serial signal coupled to a pin of said integrated circuit to transfer:
   (i) control signals from said diagnostic device to said integrated circuit to control diagnostic operations of performed by said integrated circuit; and
   (ii) diagnostic data between said diagnostic device and said integrated circuit.

23. The diagnostic device as claimed in claim 22, wherein said diagnostic device is operable to control one or more of:
   debugging operations;
   manufacturing test operations;
   manufacturing programming operations; and
   manufacturing configuration operations.

24. The diagnostic device as claimed in claim 22, wherein said bi-directional line carrying the bi-directional serial signal is operable to communicate a pacing signal from said diagnostic circuit to said diagnostic device, said pacing signal being operative to indicate whether or not said diagnostic circuit is ready for communication.

25. The diagnostic device as claimed in claim 24, wherein the bi-directional serial signal has a serial signal protocol comprising different time slots for communicating different signals, said diagnostic circuit forcing said bi-directional serial signal to a predetermined pacing level during a pacing signal time slot.

26. The diagnostic device as claimed in claim 24, wherein said interface circuit is operable in a training mode to be responsive to a training signal of a predetermined form sent from said external diagnostic device to determine sample point timing for sampling said bi-directional serial signal and said pacing signal indicates that training has completed successfully.

27. The diagnostic device as claimed in claim 22, wherein said bi-directional line carrying the bi-directional serial signal is operable to communicate a pacing signal from said diagnostic circuit to said external diagnostic device, said pacing signal being operative to indicate whether or not said diagnostic circuit has completed an operation.

28. The diagnostic device as claimed in claim 22, wherein the bi-directional serial signal has a serial signal protocol comprising different time slots for communicating different signals, said bi-directional line carrying the bi-directional serial signal being operable to communicate a start signal indicative of a start of a frame of serial data, said start signal being said bi-directional serial signal being driven to a predetermined start level to define a start signal time slot.

29. The diagnostic device as claimed in claim 28, wherein said communication is held idle by said external diagnostic device holding said bi-directional serial signal at a level different to said predetermined start level and thereby delaying said start signal time slot until said bi-directional serial signal changes to said predetermined start level followed by a next frame of data being communicated.

30. The diagnostic device as claimed in claim 22, wherein the bi-directional serial signal has a serial signal protocol comprising different time slots for communicating different signals, said bi-directional line carrying the bi-directional serial signal being operable to communicate a stop signal indicative of an end of a frame of serial data, said stop signal being said bi-directional serial signal being driven to a predetermined stop level during a stop signal time slot.

31. The diagnostic device as claimed in claim 30, wherein said diagnostic circuit uses receipt of a first part of said stop signal to indicate an abort of diagnostic operations.

32. The diagnostic device as claimed in claim 30, wherein said diagnostic circuit uses receipt of a second part of said stop signal to confirm receipt of said frame of serial data by said diagnostic circuit.

33. The diagnostic device as claimed in claim 22, wherein said interface circuit is operable in a non-clocked mode in which said communication is clocked in dependence upon transitions detected within said bi-directional serial signal.

34. The diagnostic device as claimed in claim 22, wherein said interface circuit is operable in a training mode to be responsive to a training signal of a predetermined form sent from said external diagnostic device to determine sample point timing for sampling said bi-directional serial signal.

35. The diagnostic device as claimed in claim 34, wherein said interface circuit initialises into said training mode.

36. The diagnostic device as claimed in claim 35, wherein said initialisation follows a reset of said interface circuit.

37. The diagnostic device as claimed in claim 22, wherein said diagnostic circuit comprises one or more of:
   (i) one or more scan chains operable to capture diagnostic data from said functional circuitry;
   (ii) one or more scan chains operable to apply diagnostic data to said functional circuitry; and
   (iii) one or more debug bus access circuits operable to provide communication via a bus within said functional circuit.

38. The diagnostic device as claimed in claim 22, wherein said interface circuit is operable:
   (i) in a clocked mode in which said communication is clocked by a separate clock signal used by said integrated circuit; and (ii) in a non-clocked mode in which said communication is clocked in dependence upon transitions detected within said bi-directional serial signal.

39. The diagnostic device as claimed in claim 38, wherein in said clocked mode, said communication is clocked by a clock signal being a multiple of a clock signal used by said integrated circuit.

40. The diagnostic device as claimed in claim 38, wherein said interface circuit is operable to initialise in said non-clocked mode and is switchable to said clocked mode.

41. A diagnostic device for performing diagnostic operations upon an integrated circuit, said diagnostic device comprising:
  an interface circuit operable to provide communication between said diagnostic device and a diagnostic circuit within said integrated circuit; wherein
  said interface circuit is configured to use a bi-directional line carrying a bi-directional serial signal coupled to a pin of said integrated circuit to transfer:
  (i) control signals from said diagnostic device to said integrated circuit to control diagnostic operations of performed by said integrated circuit; and
  (ii) diagnostic data between said diagnostic device and said integrated circuit,
  wherein said bi-directional serial signal is operable to communicate a reset signal from said diagnostic device to said diagnostic circuit, said reset signal being operative to reset said diagnostic circuit.

42. The diagnostic device as claimed in claim 41, wherein said reset signal comprises said diagnostic device holding said bi-directional serial signal carried by the bi-directional line at a predetermined reset level for a predetermined reset period.

43. A method of communicating with a diagnostic circuit operable to perform diagnostic operations upon an functional circuit within an integrated circuit, said method comprising the step of:
  using a bi-directional line carrying a bi-directional serial signal coupled to a pin of said integrated circuit to transfer:
  (i) control signals from an external diagnostic device to said diagnostic circuit to control said diagnostic operations of said diagnostic circuit; and
  (ii) diagnostic data between said external diagnostic device and said diagnostic circuit.

44. The method as claimed in claim 43, wherein said diagnostic circuit is operable to perform one or more of:
  debugging operations;
  manufacturing test operations;
  manufacturing programming operations; and
  manufacturing configuration operations.

45. The method as claimed in claim 43, wherein said bi-directional serial signal is operable to communicate a pacing signal from said diagnostic circuit to said external diagnostic device, said pacing signal being operative to indicate whether or not said diagnostic circuit is ready for communication.

46. The method as claimed in claim 45, wherein the bi-directional serial signal has a serial signal protocol comprising different time slots for communicating different signals, said diagnostic circuit forcing said bi-directional serial signal to a predetermined pacing level during a pacing signal time slot.

47. The method as claimed in claim 45, wherein said interface circuit is operable in a training mode to be responsive to a training signal of a predetermined form sent from said external diagnostic device to determine sample point timing for sampling said bi-directional serial signal and said pacing signal indicates that training has completed successfully.

48. The method as claimed in claim 43, wherein said bi-directional line carrying the bi-directional serial signal is operable to communicate a pacing signal from said diagnostic circuit to said external diagnostic device, said pacing signal being operative to indicate whether or not said diagnostic circuit has completed an operation.

49. The method as claimed in claim 43, wherein the bi-directional serial signal has a serial signal protocol comprising different time slots for communicating different signals, said bi-directional line carrying he bi-directional serial signal being operable to communicate a start signal indicative of a start of a frame of serial data, said start signal being said bi-directional serial signal being driven to a predetermined start level to define a start signal time slot.

50. The method as claimed in claim 49, wherein said communication is held idle by said external diagnostic device holding said bi-directional serial signal at a level different to said predetermined start level and thereby delaying said start signal time slot until said bi-directional serial signal changes to said predetermined start level followed by a next frame of data being communicated.

51. The method as claimed in claim 43, wherein the bi-directional serial signal has a serial signal protocol comprising different time slots for communicating different signals, said bi-directional line carrying the bi-directional serial signal being operable to communicate a stop signal indicative of an end of a frame of serial data, said stop signal being said bi-directional serial signal being driven to a predetermined stop level during a stop signal time slot.

52. The method as claimed in claim 51, wherein said diagnostic circuit uses receipt of a first part of said stop signal to indicate an abort of diagnostic operations.

53. The method as claimed in claim 51, wherein said diagnostic circuit uses receipt of a second part of said stop signal to confirm receipt of said frame of serial data by said diagnostic circuit.

54. The method as claimed in claim 43, wherein said interface circuit is operable in a non-clocked mode in which said communication is clocked in dependence upon transitions detected within said bi-directional serial signal.

55. The method as claimed in claim 43, wherein said interface circuit is operable in a training mode to be responsive to a training signal of a predetermined form sent from said external diagnostic device to determine sample point timing for sampling said bi-directional serial signal.

56. The method as claimed in claim 55, wherein said interface circuit initialises into said training mode.

57. The method as claimed in claim 55, wherein said initialisation follows a reset of said interface circuit.

58. The method as claimed in claim 43, wherein said diagnostic circuit comprises one or more of:
  (i) one or more scan chains operable to capture diagnostic data from said functional circuitry;
  (ii) one or more scan chains operable to apply diagnostic data to said functional circuitry; and
  (iii) one or more debug bus access circuits operable to provide communication via a bus within said functional circuit.

59. The method as claimed in claim 43, wherein said interface circuit is operable:
  (i) in a clocked mode in which said communication is clocked by a separate clock signal used by said integrated circuit; and (ii) in a non-clocked mode in which said communication is clocked in dependence upon transitions detected within said bi-directional serial signal.

60. The method as claimed in claim 59, wherein in said clocked mode, said communication is clocked by a clock signal being a multiple of a clock signal used by said integrated circuit.

61. The method as claimed in claim 59, wherein said interface circuit is operable to initialise in said non-clocked mode and is switchable to said clocked mode.

62. A method of communicating with a diagnostic circuit operable to perform diagnostic operations upon an functional circuit within an integrated circuit, said method comprising the step of:

using a bi-directional line carrying a bi-directional serial signal coupled to a pin of said integrated circuit to transfer:

(i) control signals from an external diagnostic device to said diagnostic circuit to control said diagnostic operations of said diagnostic circuit: and (ii) diagnostic data between said external diagnostic device and said diagnostic circuit, wherein said bi-directional serial signal is operable to communicate a reset signal from said external diagnostic device to said diagnostic circuit, said reset signal being operative to reset said diagnostic circuit.

63. The method as claimed in claim 62, wherein said reset signal comprises said external diagnostic device holding said bi-directional serial signal at a predetermined reset level for a predetermined reset period.

* * * * *